(12) United States Patent
Luo et al.

(10) Patent No.: US 10,673,315 B2
(45) Date of Patent: Jun. 2, 2020

(54) POWER SUPPLY CONVERSION CIRCUIT

(71) Applicant: Shanghai Awinic Technology Co., LTD, Shanghai (CN)

(72) Inventors: Xucheng Luo, Shanghai (CN); Jianwei Hu, Shanghai (CN); Jiantao Cheng, Shanghai (CN)

(73) Assignee: Shanghai Awinic Technology Co., LTD, Shanghai (CN)

( * ) Notice: Subject to any disclaimer, the term of this patent is extended or adjusted under 35 U.S.C. 154(b) by 0 days.

(21) Appl. No.: 16/186,009

(22) Filed: Nov. 9, 2018

(65) Prior Publication Data
US 2019/0190367 A1    Jun. 20, 2019

(30) Foreign Application Priority Data

Dec. 20, 2017  (CN) .......................... 2017 1 1382330

(51) Int. Cl.
*H02M 3/07*    (2006.01)
*H02M 1/14*    (2006.01)
(Continued)

(52) U.S. Cl.
CPC .............. *H02M 1/00* (2013.01); *G05F 1/577* (2013.01); *H02M 1/14* (2013.01); *H02M 3/07* (2013.01); *H02M 2001/009* (2013.01)

(58) Field of Classification Search
CPC ............. H02M 3/07; H02M 2003/076; H02M 2003/077; H02M 1/14; H02M 2001/009;
(Continued)

(56) References Cited

U.S. PATENT DOCUMENTS

| 5,831,470 A | * | 11/1998 | Park ...................... H02M 3/073 327/536 |
| 6,208,197 B1 | * | 3/2001 | Ternullo, Jr. ............ H02M 3/07 327/390 |

(Continued)

FOREIGN PATENT DOCUMENTS

| CN | 201717779 U | 1/2011 |
| CN | 102723858 A | 10/2012 |

(Continued)

OTHER PUBLICATIONS

First Office Action regarding Chinese Application No. 201711382330.1 dated Jul. 5, 2019. Summary translation provided by Unitalen Attorneys at Law.

*Primary Examiner* — Daniel Kessie
*Assistant Examiner* — Sisay G Tiku
(74) *Attorney, Agent, or Firm* — Harness, Dickey & Pierce, P.L.C.

(57) ABSTRACT

A power supply conversion circuit is provided, which includes: a first voltage clamping module configured to decrease an input voltage to a preset low voltage; a boost module configured to increase the input voltage or the preset low voltage to a target voltage; a second voltage clamping module configured to maintain the target voltage within a preset voltage range; a filter module configured to filter out ripples in the target voltage; and at least one output module, each of which is configured to supply power to a load. Compared with a conventional LDO integrated circuit, the circuit can provide multiple output power supplies, and it is only required to additionally arrange one field effect transistor for one more output power supply. Therefore, the power supply conversion circuit has a simple structure, is expandable easily and is applicable to an analog integrated circuit requiring multiple output power supplies.

9 Claims, 3 Drawing Sheets

(51) Int. Cl.
*H02M 1/00* (2006.01)
*G05F 1/563* (2006.01)
*G05F 1/577* (2006.01)

(58) Field of Classification Search
CPC .. H02M 2001/007; G05F 1/563; G05F 1/618; G05F 1/614
USPC ........................................ 323/266; 363/59–60
See application file for complete search history.

(56) References Cited

U.S. PATENT DOCUMENTS

| | | | | |
|---|---|---|---|---|
| 6,509,894 B1* | 1/2003 | Maekawa | ............ | G09G 3/3696 323/313 |
| 7,528,828 B2* | 5/2009 | Nakajima | ............ | G09G 3/3696 345/204 |
| 7,592,858 B1* | 9/2009 | Jung | ........................ | H03K 5/08 327/333 |
| 9,106,228 B2 | 8/2015 | Genest | | |
| 2011/0148384 A1* | 6/2011 | Chung | .................... | H02M 3/07 323/299 |
| 2011/0193539 A1 | 8/2011 | Schmidt et al. | | |
| 2012/0236444 A1* | 9/2012 | Srivastava | .......... | H01L 27/0285 361/56 |
| 2014/0253180 A1* | 9/2014 | Wang et al. | ............. | H02M 3/07 327/109 |
| 2014/0268936 A1* | 9/2014 | Lu | ........................... | H02M 1/36 363/49 |
| 2014/0375376 A1 | 12/2014 | Genest | | |
| 2015/0019882 A1* | 1/2015 | Irish | .......................... | G06F 1/26 713/300 |
| 2015/0366014 A1* | 12/2015 | Itoh | .................... | H05B 33/0815 315/200 R |
| 2016/0344284 A1* | 11/2016 | Summer | .............. | H03H 7/0107 |

FOREIGN PATENT DOCUMENTS

| | | |
|---|---|---|
| CN | 204131377 U | 1/2015 |
| CN | 104699153 A | 6/2015 |

\* cited by examiner

POWER SUPPLY CONVERSION CIRCUIT

The present application claims priority to Chinese Patent Application No. 201711382330.1, titled "POWER SUPPLY CONVERSION CIRCUIT", filed on Dec. 20, 2017 with the Chinese Patent Office, which is incorporated herein by reference in its entirety.

FIELD

The present disclosure relates to the technical field of a power supply conversion circuit of an integrated circuit, and in particular to a power supply conversion circuit.

BACKGROUND

With the continuous development of science and technology, various electronic devices are widely used in people's work and daily life, and bring great convenience to people's work and daily life.

For an analog integrated circuit, in a case that an input voltage varies in a wide range, it is required to convert the input voltage varying in the wide range into a low constant voltage using a power supply conversion module, to supply power to an internal circuit using the low constant voltage.

In a conventional power supply conversion method, a low dropout regulator (LDO) is integrated in a chip. In the LDO, an applied input voltage is decreased by an excessive voltage through a transistor operating in its linear region, to generate a regulated output voltage.

The LDO has an advantage of a high-precision output voltage. However, for the LDO, it is required to provide a reference voltage in a bandgap voltage reference and complicated feedback loop compensation is involved, thereby resulting in a highly complicated design and occupying a large chip area. For some analog integrated circuits, the requirement on the precision of a power supply voltage is not very high, it is only required that the power supply voltage is within a safe range such that an internal circuit is not burnt. In addition, the requirement on the power supply capability is also not very high, which is usually below a level of mA, the usage of LDO may result in an unnecessary additional cost.

Currently, there is not a simple and reliable technology for providing multiple output power supplies. For example, with the LDO, only one output power supply may be provided. If two output power supplies are demanded, it is required to arrange two LDOs, thereby occupying a larger chip area.

SUMMARY

In order to solve the above problem, a power supply conversion circuit is provided according to the present disclosure, which is configured to generate multiple output power supplies, and with which the problem in the conventional technology is solved.

The following technical solutions are provided according to the present disclosure.

A power supply conversion circuit is provided, which includes a first voltage clamping module, a boost module, a second voltage clamping module, a filter module and at least one output module. The first voltage clamping module is configured to decrease an input voltage to a preset low voltage. The boost module is configured to increase the input voltage or the preset low voltage to a target voltage. The second voltage clamping module is configured to maintain the target voltage within a preset voltage range. The filter module is configured to filter out ripples in the target voltage. Each of the at least one output module is configured to supply power to a load.

In an embodiment, in the above power supply conversion circuit, the first voltage clamping module includes a first resistor and a first diode. One terminal of the first resistor is connected to a voltage input terminal, another terminal of the first resistor is connected to a cathode of the first diode, and an anode of the first diode is grounded.

In an embodiment, in the above power supply conversion circuit, the first diode is a voltage stabilizing diode.

In an embodiment, in the above power supply conversion circuit, the boost module includes a charge pump, an oscillator and a second diode. A first terminal of the charge pump and an anode of the second diode are connected to the terminal of the first resistor connected to the cathode of the first diode, a second terminal of the charge pump is connected to a cathode of the second diode, a third terminal of the charge pump is connected to one terminal of the oscillator, and another terminal of the oscillator is connected to one of the at least one output module.

In an embodiment, in the above power supply conversion circuit, the second voltage clamping module includes a third diode and a first field effect transistor. A cathode of the third diode is connected to a second terminal of the charge pump, an anode of the third diode is connected to a drain of the first field effect transistor, a gate of the first field effect transistor is connected to the drain of the first field effect transistor, and a source of the first field effect transistor is grounded.

In an embodiment, in the above power supply conversion circuit, the third diode is a voltage stabilizing diode.

In an embodiment, in the above power supply conversion circuit, the second voltage clamping module includes multiple diodes connected in series and one voltage stabilizing diode. An anode of the voltage stabilizing diode is connected to an anode of a circuit formed by the multiple diodes connected in series, a cathode of the voltage stabilizing diode is connected to the second terminal of the charge pump, and a cathode of the circuit formed by the multiple diodes connected in series is grounded.

In an embodiment, in the above power supply conversion circuit, the filter module includes a second resistor and a capacitor. One terminal of the second resistor is connected to the second terminal of the charge pump, another terminal of the second resistor is connected to one terminal of the capacitor, and another terminal of the capacitor is grounded.

In an embodiment, in the above power supply conversion circuit, the output module includes a field effect transistor. A gate of the field effect transistor is connected to the another terminal of the second resistor connected to the one terminal of the capacitor, a drain of the field effect transistor is connected to the voltage input terminal, and a source of the field effect transistor is connected to the load.

It can be known from the above description that, a power supply conversion circuit provided in the present disclosure includes a first voltage clamping module, a boost module, a second voltage clamping module, a filter module and at least one output module. The first voltage clamping module is configured to decrease an input voltage to a preset low voltage. The boost module is configured to increase the input voltage or the preset low voltage to a target voltage. The second voltage clamping module is configured to maintain the target voltage within a preset voltage range. The filter module is configured to filter out ripples in the target voltage. Each of the at least one output module is configured to supply power to a load.

With the power supply conversion circuit, multiple output power supplies can be provided, and the power supply conversion circuit has a simple structure and is expandable easily.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments of the present disclosure without any creative work should fall within the protection scope of the present disclosure.

In order to make the objects, features and advantages of the present disclosure descried above more obvious and be understood more easily, description to the present disclosure are made in more detail in conjunction with specific embodiments and the drawings hereinafter.

Figure 1:
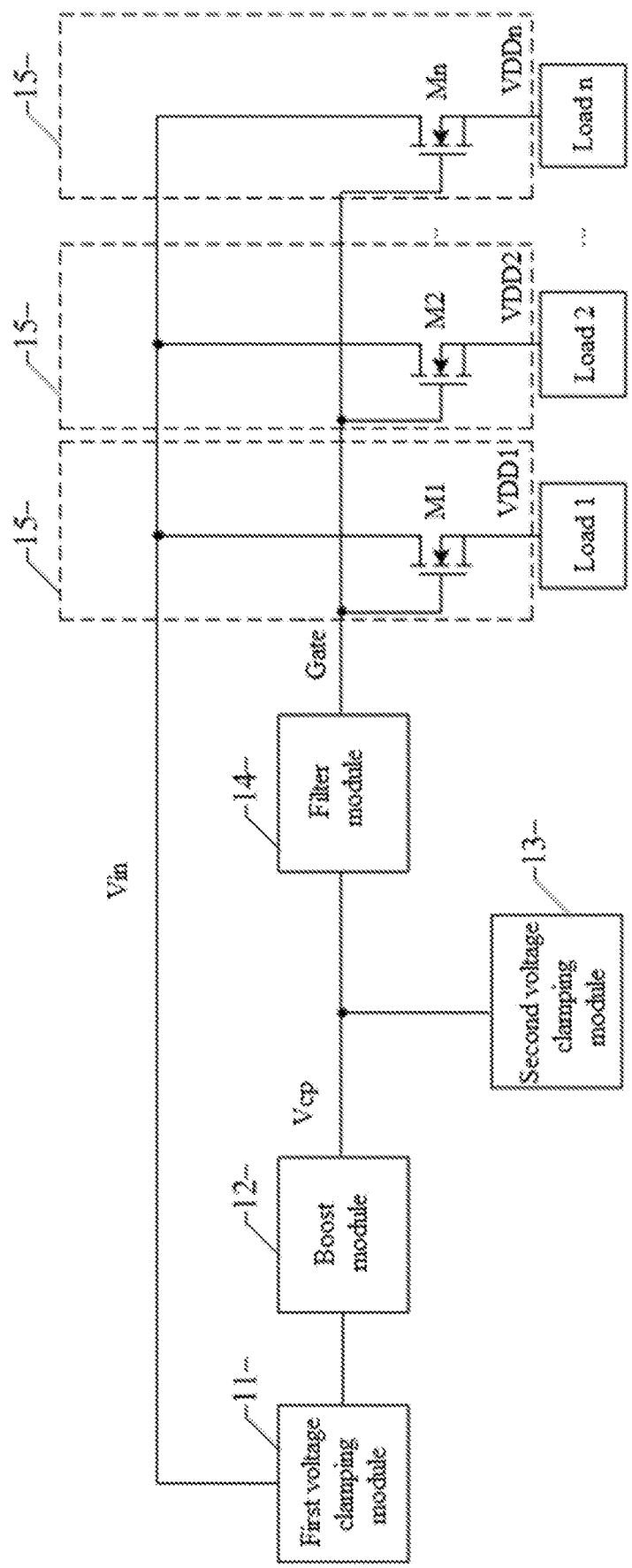
FIG. 1 is a schematic structural diagram of a power supply conversion circuit according to an embodiment of the present disclosure.

Reference is made to FIG. 1, which is a schematic structural diagram of a power supply conversion circuit according to an embodiment of the present disclosure.

The power supply conversion circuit includes a first voltage clamping module 11, a boost module 12, a second voltage clamping module 13, a filter module 14 and at least one output module 15. The first voltage clamping module 11 is configured to decrease an input voltage Vin to a preset low voltage. The boost module 12 is configured to increase the input voltage Vin or the preset low voltage to a target voltage. The second voltage clamping module 13 is configured to maintain the target voltage within a preset voltage range. The filter module 14 is configured to filter out ripples in the target voltage. Each of the at least one output module 15 is configured to supply power to a load.

Compared with a LDO integrated circuit according to the conventional technology, the power supply conversion circuit according to the present disclosure can provide multiple output power supplies. In addition, the power supply conversion circuit has a simple structure and is expandable easily, thus the power supply conversion circuit is applicable to an analog integrated circuit requiring multiple power supplies.

Figure 2:
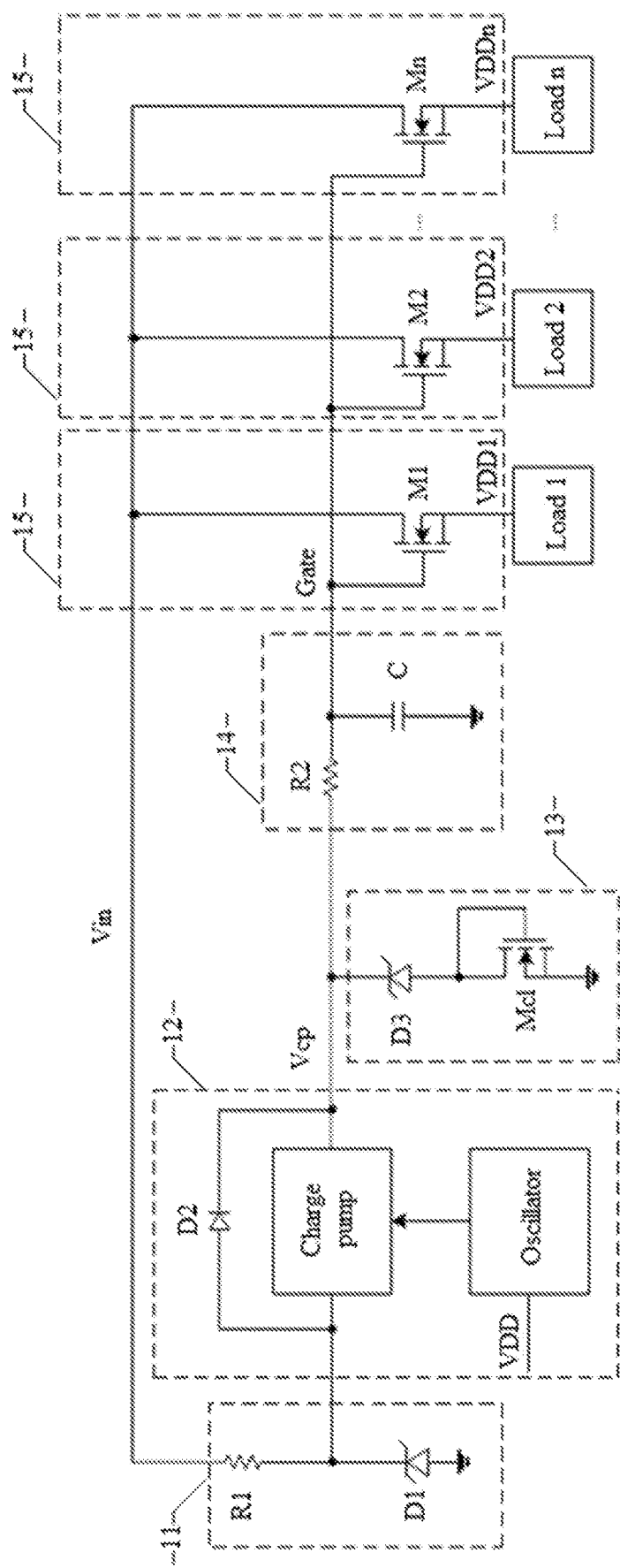
FIG. 2 is a schematic structural diagram of a power supply conversion circuit according to another embodiment of the present disclosure.

Reference is made to FIG. 2, which is a schematic structural diagram of a power supply conversion circuit according to another embodiment of the present disclosure.

As shown in FIG. 2, the first voltage clamping module 11 includes a first resistor R1 and a first diode D1.

One terminal of the first resistor R1 is connected to a voltage input terminal, the other terminal of the first resistor R1 is connected to a cathode of the first diode D1, and an anode of the first diode D1 is grounded.

Specifically, the first voltage clamping module 11 is configured to decrease an input voltage Vin to a constant preset low voltage. It is to be noted that the first voltage clamping module 11 only operates when the input voltage Vin is too high. For example, in a case of Vin<8.8V, an output voltage of the first voltage clamping module 11 is equal to the input voltage Vin.

In an embodiment, the first diode D1 is a voltage stabilizing diode.

Further, as shown in FIG. 2, the boost module 12 includes a charge pump, an oscillator and a second diode D2.

A first terminal of the charge pump and an anode of the second diode D2 are connected to the terminal of the first resistor R1 connected to the cathode of the first diode D1, a second terminal of the charge pump is connected to a cathode of the second diode D2, a third terminal of the charge pump is connected to one terminal of the oscillator, and the other terminal of the oscillator is connected to one of the at least one output module 15.

Specifically, the boost module 12 is configured to increase the input voltage Vin or the preset low voltage to a target voltage, to avoid a loss in voltage caused by a threshold voltage of a field effect transistor in the power supply conversion circuit.

Further, as shown in FIG. 2, the second voltage clamping module 13 includes a third diode D3 and a first field effect transistor Mc1.

A cathode of the third diode D3 is connected to the second terminal of the charge pump, an anode of the third diode D3 is connected to a drain of the first field effect transistor Mc1, a gate of the first field effect transistor Mc1 is connected to the drain of the first field effect transistor Mc1, and a source of the first field effect transistor Mc1 is grounded.

Specifically, since the power supply conversion circuit is configured to supply power to a low voltage circuit in most cases, the second voltage clamping module 13 is arranged to maintain the voltage within a safe range, to prevent the low voltage circuit from being broken down.

In an embodiment, the third diode D3 is a voltage stabilizing diode. It is to be noted that the first field effect transistor Mc1 is a N-type field effect transistor.

Figure 3:
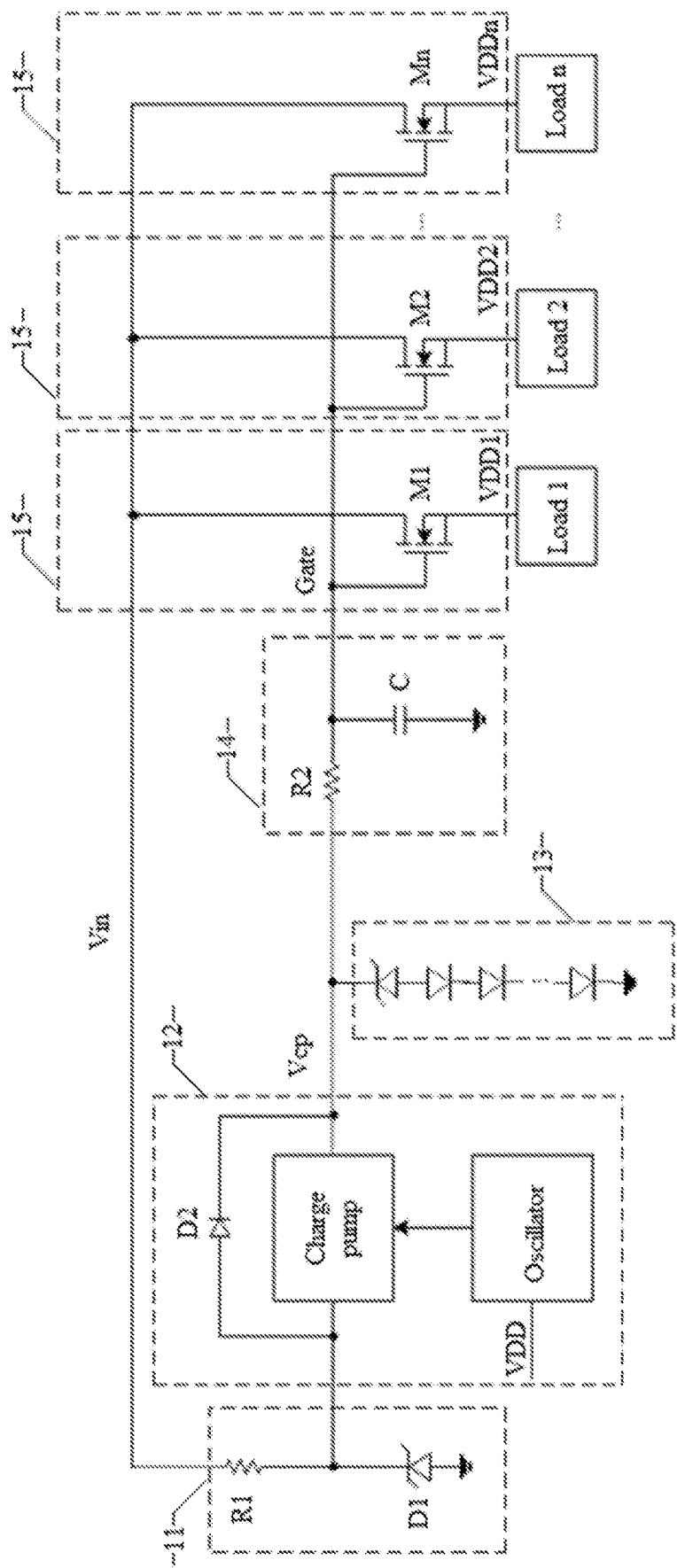
FIG. 3 is a schematic structural diagram of a power supply conversion circuit according to another embodiment of the present disclosure.

Alternatively, as shown in FIG. 3, the second voltage clamping module 13 includes multiple diodes connected in series and one voltage stabilizing diode.

An anode of the voltage stabilizing diode is connected to an anode of a circuit formed by the multiple diodes connected in series, a cathode of the voltage stabilizing diode is connected to the second terminal of the charge pump, and a cathode of the circuit formed by the multiple diodes connected in series is grounded.

Specifically, a clamped voltage may be controlled by controlling the number of the diodes connected in series.

Further, as shown in FIG. 2, the filter module 14 includes a second resistor R2 and a capacitor C.

One terminal of the second resistor R2 is connected to the second terminal of the charge pump, the other terminal of the second resistor R2 is connected to one terminal of the capacitor C, and the other terminal of the capacitor C is grounded.

Specifically, ripples in a voltage Vcp outputted by the boost module 12 is filtered out by the filter module 14, such that the voltage Vcp is stable. In addition, in a case that the voltage inputted to the power supply has a sudden change such as a hop or a jitter, the capacitor C is arranged to smooth the inputted voltage, such that an output voltage of the output module 15 is more stable.

Further, as shown in FIG. 2, the output module 15 includes a field effect transistor.

A gate of the field effect transistor is connected to the terminal of the second resistor R2 connected to the one terminal of the capacitor C, a drain of the field effect transistor is connected to the voltage input terminal, and a source of the field effect transistor is connected to the load.

Specifically, as shown in FIG. 2, the power supply conversion circuit includes multiple output modules, that is, multiple field effect transistors M1, M2, . . . , Mn (n is a positive integer). The multiple output modules may respectively output voltages VDD1, VDD2, . . . , VDDn (n is a positive integer). For the power supply conversion circuit, since it is only required to additionally arrange one field effect transistor for one more output power supply, the power supply conversion circuit has a simple circuit structure and is expandable easily. Therefore, the power supply conversion circuit is applicable to an analog integrated circuit requiring multiple output power supplies.

It is to be noted that the field effect transistor is a N-type field effect transistor.

In the embodiment of the present disclosure, the operating principle of the power supply conversion circuit is described as follows.

The multiple output voltages of the power supply conversion circuit are respectively provided by the multiple field effect transistors M1, M2, . . . , Mn. The input voltage Vin is converted to low output voltages VDD1, VDD2, . . . , VDDn respectively by the multiple field effect transistors M1, M2, . . . , Mn. In addition, the first voltage clamping module 11, the boost module 12, the second voltage clamping module 13 and the filter module 14 are arranged to control a gate voltage (Gate) of the field effect transistor in the output module 15.

The first voltage clamping module 11 is configured to decrease the input voltage Vin to a constant preset low voltage. It is to be noted that the first voltage clamping module 11 only operates when the input voltage Vin is too high. For example, in a case of Vin<8.8V, the output voltage of the first voltage clamping module 11 is equal to the input voltage Vin.

The boost module 12 is configured to output, when the input voltage Vin is low or when the input voltage is decreased to the preset low voltage by the first voltage clamping module 11, a gate voltage (Gate) higher than the input voltage Vin, that is, the target voltage Vcp. Without the boost module 12, the gate voltage (Gate) is lower than or equal to the input voltage Vin, in this case, the output voltages VDD1, VDD2, . . . , VDDn of the output module 15 is at least Vth lower than the input voltage Vin (which is the threshold voltage of the field effect transistor in the output module 15 and is approximately 0.8 V).

The output voltages VDD1, VDD2, . . . , VDDn of the output module 15 may be Vcp−Vgs at the maximum, Vgs represents a source-drain voltage of the field effect transistor in the output module. Since the output voltages VDD1, VDD2, . . . , VDDn are mostly supplied to low voltage circuits, it is required that the output voltages VDD1, VDD2, . . . , VDDn are not too high, so as to protect the low voltage circuits from being broken down, which indicates that Vcp is not too high. Therefore, the second voltage clamping module 13 is arranged to maintain the target voltage Vcp within a safe preset voltage range.

The ripples of the target voltage Vcp is filtered out by the filter module 13, such that the gate voltage (Gate) is stable. In addition, in a case that the voltage inputted to the power supply has a sudden change such as a hop or a jitter, the capacitor C is arranged to smooth the inputted voltage, such that an output voltage of the output module 15 is more stable.

It can be known that, compared with the LDO integrated circuit according to the conventional technology, the power supply conversion circuit according to the present disclosure can provide multiple output power supplies. For the power supply conversion circuit, since it is only required to additionally arrange one field effect transistor for one more output power supply, the power supply conversion circuit has a simple circuit structure and is expandable easily. Therefore, the power supply conversion circuit is applicable to an analog integrated circuit requiring multiple output power supplies.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. A power supply conversion circuit, comprising:
a first voltage clamping module configured to decrease an input voltage to a preset low voltage in a case that the input voltage is higher than the preset low voltage, or output the input voltage in a case that the input voltage is lower than the preset low voltage, wherein the first voltage clamping module comprises a first resistor and a first diode, and one terminal of the first resistor is connected to a voltage input terminal, another terminal of the first resistor is connected to a cathode of the first diode, and an anode of the first diode is grounded;
a boost module configured to increase the input voltage or the preset low voltage to a target voltage, wherein the boost module comprises a charge pump, and oscillator and a second diode, and a first terminal of the charge pump and an anode of the second diode are connected to the another terminal of the first resistor connected to the cathode of the first diode, a second terminal of the charge pump is connected to a cathode of the second diode, a third terminal of the charge pump is connected to one terminal of the oscillator, and another terminal of the oscillator is connected to one of the at least one output module;
a second voltage clamping module configured to maintain the target voltage within a preset voltage range;
a filter module configured to filter out ripples in the target voltage; and
at least one output module, wherein each of the at least one output module is configured to supply power to a load.

2. The power supply conversion circuit according to claim 1, wherein the first diode is a voltage stabilizing diode.

3. The power supply conversion circuit according to claim 1, wherein the second voltage clamping module comprises a third diode and a first field effect transistor, and wherein
a cathode of the third diode is connected to the second terminal of the charge pump, an anode of the third diode is connected to a drain of the first field effect transistor, a gate of the first field effect transistor is connected to the drain of the first field effect transistor, and a source of the first field effect transistor is grounded.

4. The power supply conversion circuit according to claim 3, wherein the third diode is a voltage stabilizing diode.

5. The power supply conversion circuit according to claim 3, wherein the filter module comprises a second resistor and a capacitor, and wherein
one terminal of the second resistor is connected to the second terminal of the charge pump, another terminal of the second resistor is connected to one terminal of the capacitor, and another terminal of the capacitor is grounded.

6. The power supply conversion circuit according to claim 5, wherein the output module comprises a field effect transistor, and wherein
a gate of the field effect transistor is connected to the terminal of the second resistor connected to the one terminal of the capacitor, a drain of the field effect transistor is connected to the voltage input terminal, and a source of the field effect transistor is connected to the load.

7. The power supply conversion circuit according to claim 1, wherein the second voltage clamping module comprises a plurality of diodes connected in series and one voltage stabilizing diode, and wherein
an anode of the voltage stabilizing diode is connected to an anode of a circuit formed by the plurality of diodes connected in series, a cathode of the voltage stabilizing diode is connected to the second terminal of the charge pump, and a cathode of the circuit formed by the plurality of diodes connected in series is grounded.

8. The power supply conversion circuit according to claim 7, wherein the filter module comprises a second resistor and a capacitor, and wherein
one terminal of the second resistor is connected to the second terminal of the charge pump, another terminal of the second resistor is connected to one terminal of the capacitor, and another terminal of the capacitor is grounded.

9. The power supply conversion circuit according to claim 8, wherein the output module comprises a field effect transistor, and wherein
a gate of the field effect transistor is connected to the terminal of the second resistor connected to the one terminal of the capacitor, a drain of the field effect transistor is connected to the voltage input terminal, and a source of the field effect transistor is connected to the load.

* * * * *